(12) United States Patent
Wittl et al.

(10) Patent No.: US 7,182,526 B1
(45) Date of Patent: Feb. 27, 2007

(54) MODULAR SYSTEM OF OPTOELECTRONIC COMPONENTS, AND OPTOELECTRONIC COMPONENT FOR USE IN SUCH A SYSTEM

(75) Inventors: Josef Wittl, Parsberg (DE); Hans Hurt, Regensburg (DE)

(73) Assignee: Infineon Technologies AG, Munich (DE)

(*) Notice: Subject to any disclaimer, the term of this patent is extended or adjusted under 35 U.S.C. 154(b) by 201 days.

(21) Appl. No.: 10/407,735

(22) Filed: Apr. 4, 2003

(30) Foreign Application Priority Data
Feb. 4, 2003 (EP) ............................ 03090030

(51) Int. Cl.
*G02B 6/36* (2006.01)
(52) U.S. Cl. ..................... 385/89; 385/88; 385/92; 385/93
(58) Field of Classification Search ............ 385/88–94, 385/14–15, 129, 134–135, 31, 33, 39, 50, 385/52, 55–56, 60, 72, 75–76, 78; 350/96.17, 350/96.2, 96.21
See application file for complete search history.

(56) References Cited

U.S. PATENT DOCUMENTS

| | | | | |
|---|---|---|---|---|
| 4,461,537 | A * | 7/1984 | Raymer et al. ............... | 385/88 |
| 4,826,272 | A * | 5/1989 | Pimpinella et al. ........... | 385/92 |
| 5,414,787 | A * | 5/1995 | Kurata ........................ | 385/92 |
| 5,511,138 | A * | 4/1996 | Lebby et al. ................. | 385/14 |
| 5,655,042 | A * | 8/1997 | Atanovich et al. ........... | 385/88 |
| 5,729,644 | A * | 3/1998 | Shiflett et al. ................ | 385/59 |
| 5,737,458 | A | 4/1998 | Wojnarowski et al. ....... | 385/15 |
| 5,970,193 | A * | 10/1999 | Stratton et al. .............. | 385/89 |
| 6,115,521 | A | 9/2000 | Tran et al. .................... | 385/52 |
| 6,257,773 | B1 | 7/2001 | Moriyama et al. ........... | 385/92 |
| 6,302,596 | B1 * | 10/2001 | Cohen et al. ................. | 385/93 |
| 6,309,566 | B1 | 10/2001 | Müller et al. ............... | 264/1.25 |
| 6,318,908 | B1 * | 11/2001 | Nakanishi et al. ........... | 385/89 |
| 6,416,238 | B1 * | 7/2002 | Gilliland et al. ............. | 385/88 |

(Continued)

FOREIGN PATENT DOCUMENTS

DE    195 36 689 A1    4/1996

(Continued)

OTHER PUBLICATIONS

"Fiber Service Platform II FSP-II Datasheet", *ADVA Optical networking*, Jul. 2000, XP002249279, URL:www.advaoptical.com/Datasheets/FSP-II.pdf.

(Continued)

*Primary Examiner*—Frank G. Font
*Assistant Examiner*—Ryan Lepisto
(74) *Attorney, Agent, or Firm*—Laurence A. Greenberg; Werner H. Stemer; Ralph E. Locher

(57) ABSTRACT

In a modular system of optoelectronic components each component has a standardized housing. The standard housing has a device for the mechanical connection to at least one housing of a further component, or it is connected to such a device. This allows different combinations to be produced using the same system components. Flat optoelectronic components are particularly suitable for use in the modular system. In this case, according to the invention, an optical waveguide is integrated in the component, runs parallel to a circuit mount, and forms an optical interface on one narrow housing face. The electrical contacts of the component are likewise arranged on a narrow housing face.

31 Claims, 11 Drawing Sheets

U.S. PATENT DOCUMENTS

| | | | |
|---|---|---|---|
| 6,483,960 B2 | 11/2002 | Schroedinger | 385/14 |
| 6,533,470 B2 * | 3/2003 | Ahrens | 385/88 |
| 6,583,902 B1 * | 6/2003 | Yuen | 398/135 |
| 6,623,179 B2 * | 9/2003 | Hurt et al. | 385/92 |
| 6,860,647 B2 * | 3/2005 | Yamabayashi et al. | 385/88 |

FOREIGN PATENT DOCUMENTS

| | | |
|---|---|---|
| DE | 199 32 430 A1 | 2/2001 |
| DE | 100 65 034 A1 | 8/2001 |
| EP | 0 690 319 A1 | 1/1996 |
| EP | 0 938 005 A2 | 8/1999 |
| EP | 1 168 022 A2 | 1/2002 |
| WO | 96/34413 | 10/1996 |

OTHER PUBLICATIONS

Jörg Wirtgen: "Leise AllesKönner Micro-ATX-Boards mit Nvidia nForce" [silent multitalents micro-ATX-boards with Nvidia Nforce], *C'T Magazin für Computertechnik*, No. 6, Mar. 11, 2002, pp. 146-148, XP002249278.

* cited by examiner

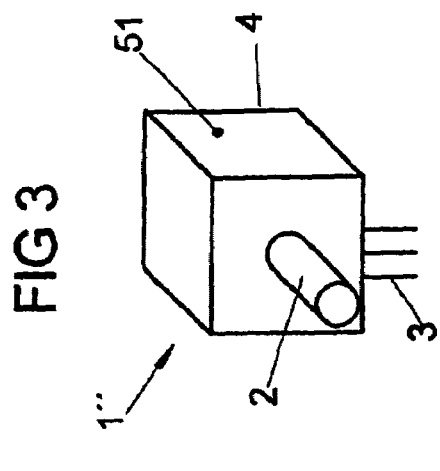
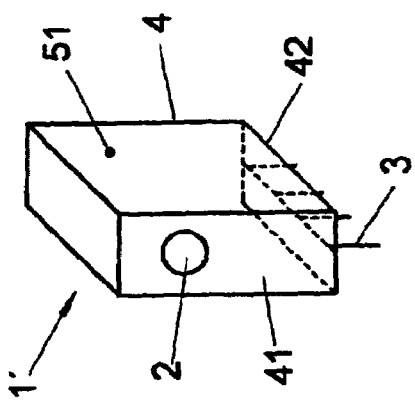
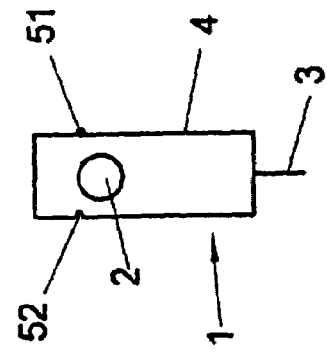
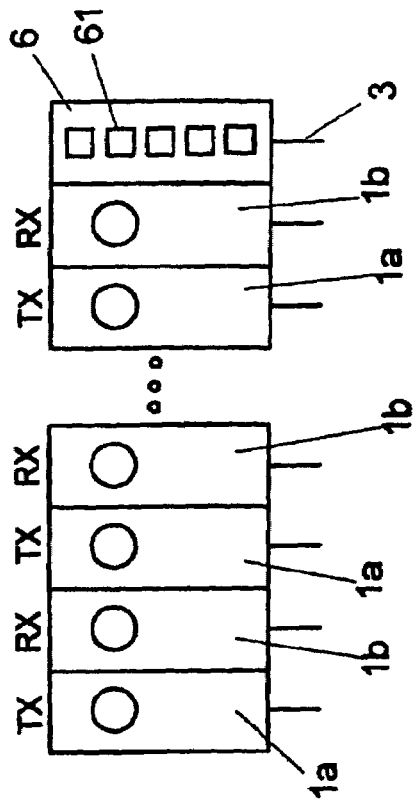
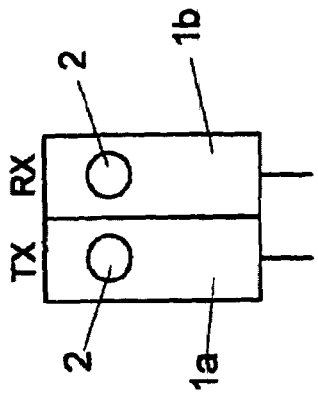

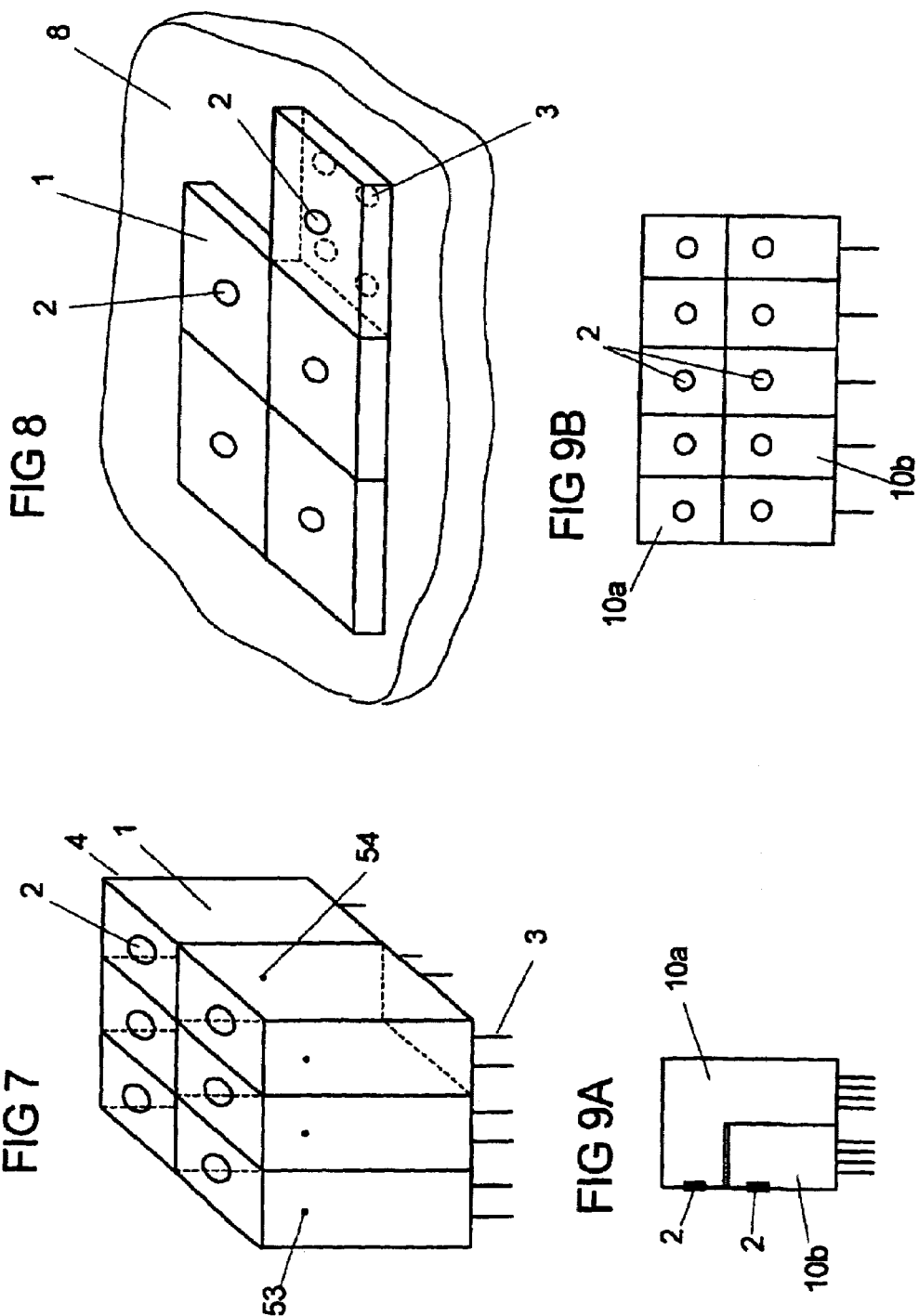

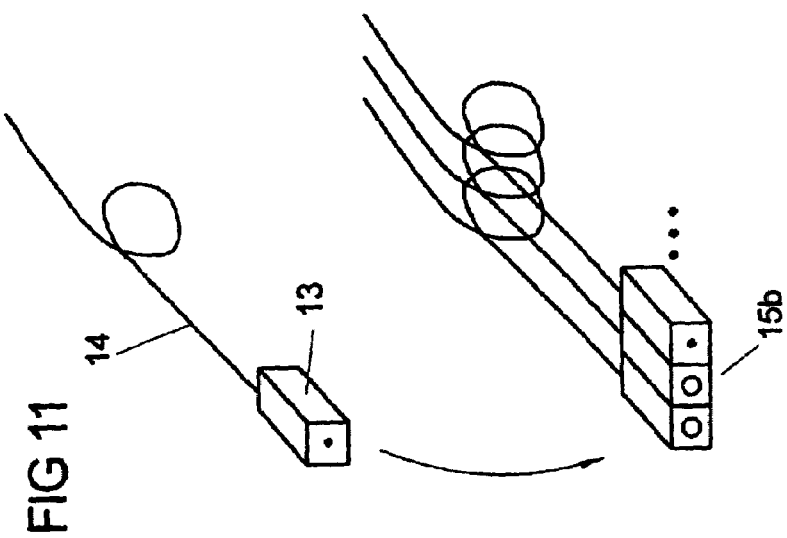
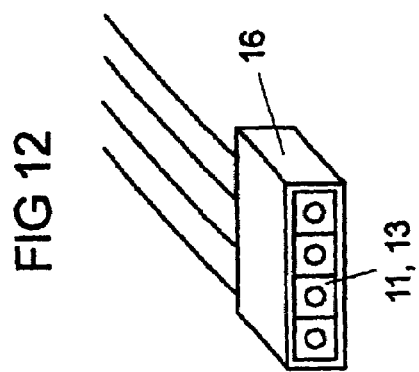
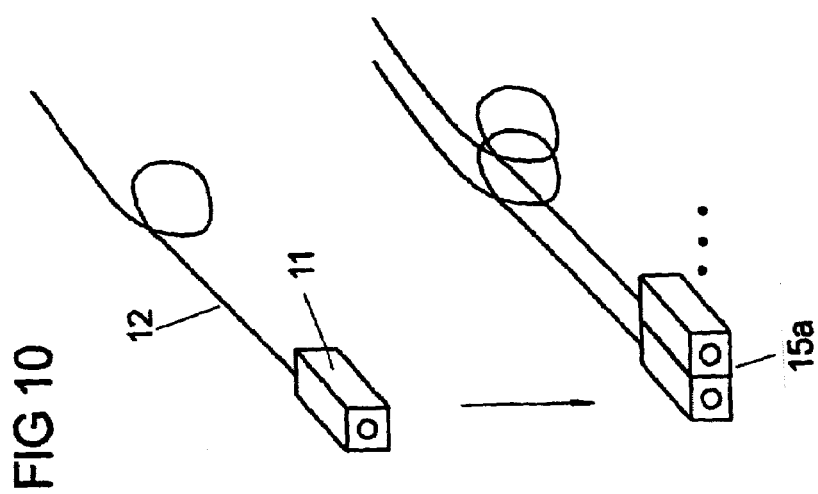

FIG 14
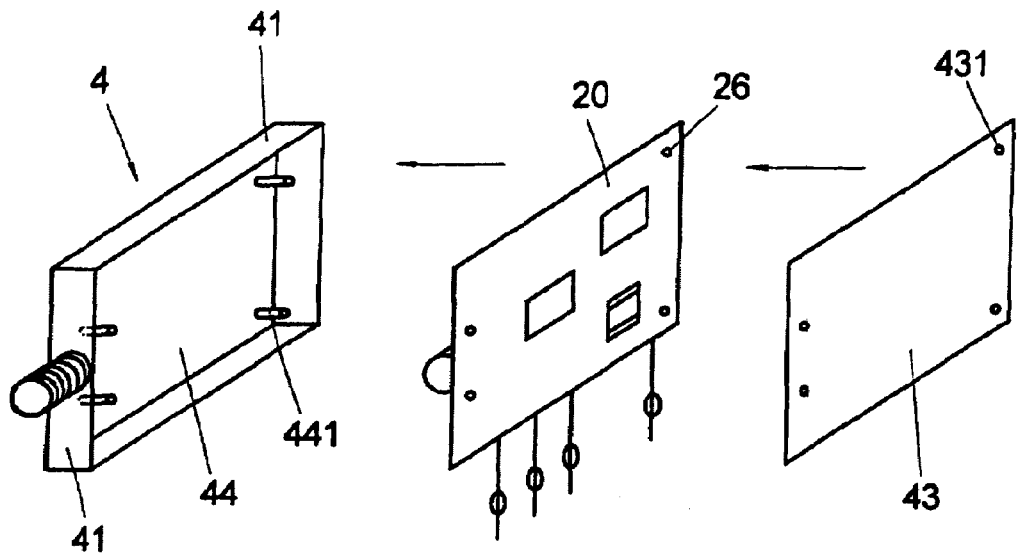
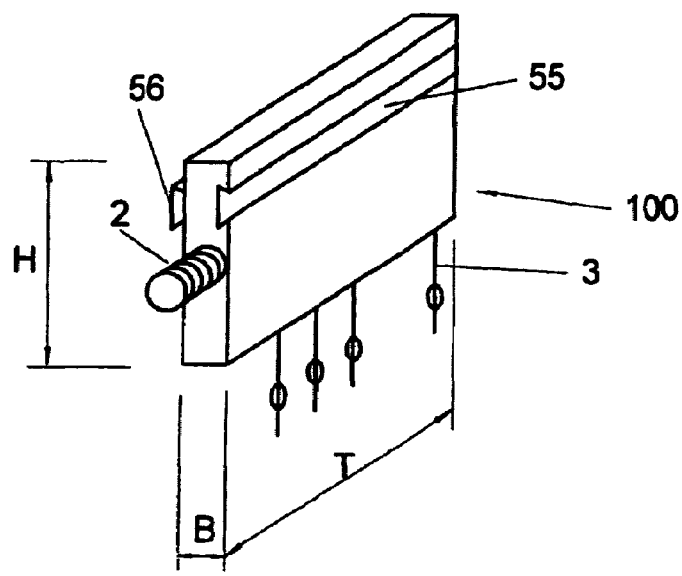

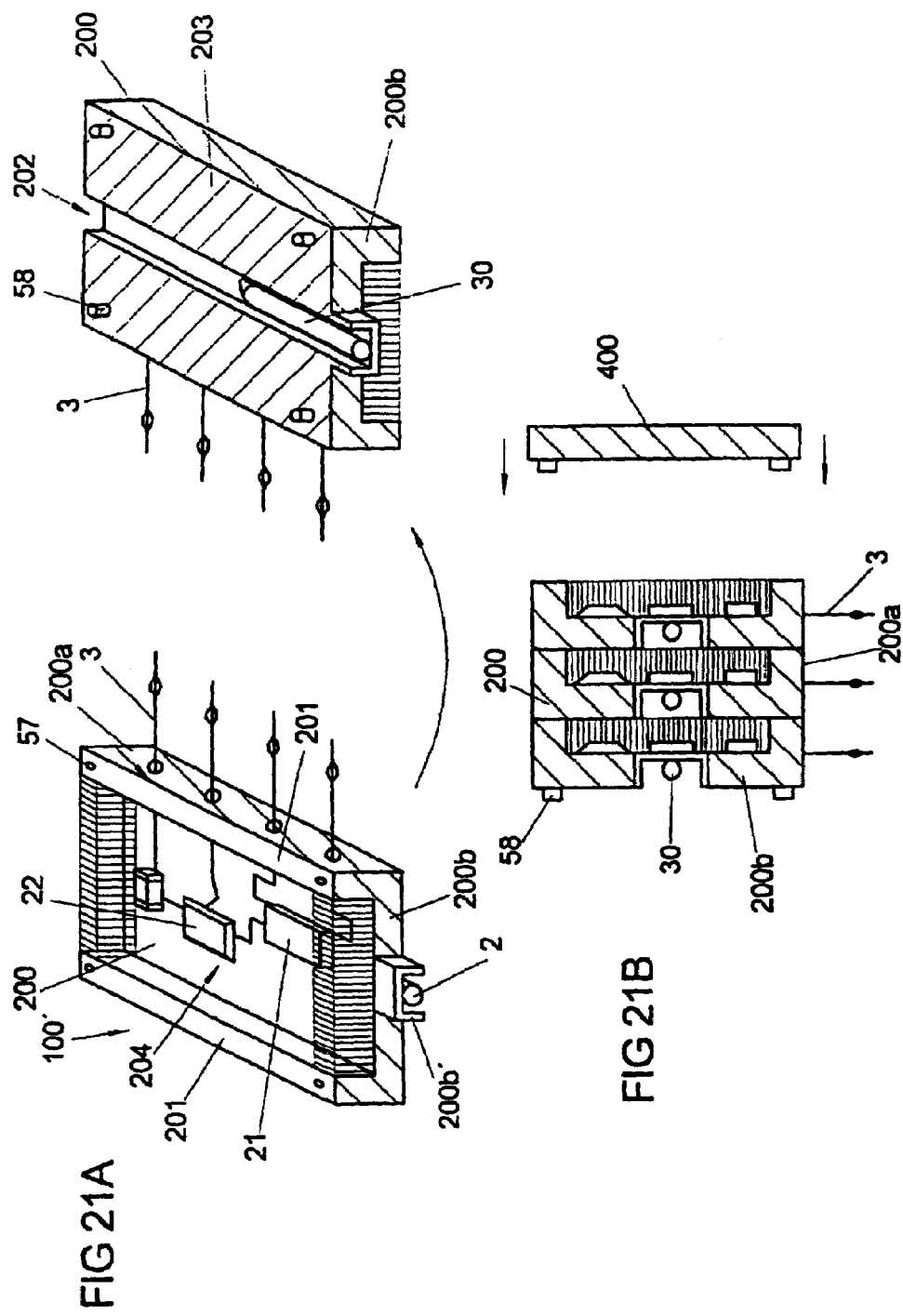

MODULAR SYSTEM OF OPTOELECTRONIC COMPONENTS, AND OPTOELECTRONIC COMPONENT FOR USE IN SUCH A SYSTEM

BACKGROUND OF THE INVENTION

Field of the Invention

Optoelectronic components that are known from the prior art cannot easily be combined with one another in different manners. Different applications, some of which are customer-specific, thus require a high degree of individual labor and design effort. The same is true for electrical interface elements and cable plugs which are connected to optoelectronic components. Despite a very wide range of products and variants, only a low level of flexibility exists in production and in system design. The implementation of specific applications is thus accordingly disadvantageously associated with high costs.

A further disadvantage of prior art optoelectronic components is that, generally, they are relatively wide. They thus cannot be used, or can be used only to a restricted extent, in particular for motor vehicle technology and for multimedia networking. Frequently, optoelectronic components are required here which have only a narrow width with a high integration density, and which can at the same time be produced easily and at low cost.

German patent application DE 199 32 430 A1 discloses an optoelectronic assembly in which an optical waveguide is disposed in a retaining groove on a first component. A second component is fitted with an optical transmitter and an optical receiver. The two components are fitted to one another such that the optical transmitter and the optical receiver are optically coupled to the optical waveguide, with two mirrors additionally being provided, which deflect the light through 90°. The prior art assembly is relatively large, and it is thus not suitable for combination with other assemblies.

SUMMARY OF THE INVENTION

It is accordingly an object of the invention to provide an optoelectronic component and a modular system of optoelectronic components, which overcome the above-mentioned disadvantages of the heretofore-known devices and methods of this general type and which allows the optoelectronic components to be combined differently with one another in a simple manner. A further object is to provide an optoelectronic component which has only a narrow width in order to allow it to be used in particular in motor vehicle technology and for multimedia networking, and which can be produced at low cost.

With the foregoing and other objects in view there is provided, in accordance with the invention, a modular system of optoelectronic components, comprising:

a plurality of prefabricated optoelectronic components selected from the group consisting of transmitting components, receiving components, and transceiver components;

each of said components having a standardized housing formed with or connected to a connecting device for mechanically connecting said housing to at least one respectively other housing of a further component.

In other words, the invention provides for a modular system which, as prefabricated components, has transmitting components, receiving components and/or transceiver components. Each component has a standardized housing, which has means for mechanical connection to at least one housing of a further component, or it is connected to such a means.

A modular building-block system is thus proposed, which is based on basic components that can be produced easily and can then be connected in different ways to form complicated configuration. This results in a highly flexible system design, which opens up a wide range of combination options.

The individual components may in this case be combined both by the component manufacturer and by the end user.

The individually prefabricated components may be transmitting components, receiving components or transceiver components, with the latter containing a module with a transmitter and a receiver. The components may, for example, be assembled in one dimension to form a transmitter strip, a receiver strip or a transceiver strip, for example for parallel optical connections. In addition to a wide range of individual combinations, this has the advantage in comparison to solutions in which a transmitter, a receiver or transceiver strip is produced integrally that, if a transmitter/receiver/transceiver fails, the faulty part can be replaced on its own. The components may also be linked in two dimensions.

The solution according to the invention provides for the capability for the individual components to be connected to one another to form an overall module, by each component having a standardized housing with means for mechanical connection to the housing of a further component, or the housing being connected to such means. This allows the individual components to be combined in a simple manner.

For the purposes of the present invention, a standardized housing is a housing which has a defined geometry which is possessed by all the optoelectronic components in the system, or at least by a subgroup of the optoelectronic components in the system. This does not in any way mean that there is any need for a national, international or industry standard. A housing may in this case be any structure that forms an outer surface of the component. For example, the housing may be formed by a three-dimensional circuit mount, which also carries out the function of a housing.

The means for mechanical connection are in one preferred embodiment of the invention in the form of mechanical connecting elements which allow plug-in connection of the housings, in particular as a latching element, an interlocking element or attachment pin. The connecting means are thus, for example, latching hooks, guide grooves, pins or the like. These attachment means allow two housings or two components to be mechanically directly connected.

In one alternative preferred refinement, the means for mechanical connection are in the form of a surrounding housing which holds a large number of components. The components are in this case installed in the surrounding housing and, to this extent, are connected to it. This also results in improved handling. The surrounding housing may in this case provide additional functionalities, in particular acting as an electrical shield for the entire module, or acting as a cooling body. Different combination options for the components can be created in a simple manner by providing a number of surrounding housings of different widths. It is also possible to provide for the surrounding housings to have the capability to be connected to further surrounding housings by mechanical connecting means.

The described system can be extended by way of further system components. Electrical interface elements which can be connected to a circuit mount, for example coupling elements for electrical plugs, are preferably provided as further system components, with the housings of the interface elements each having means for mechanical connection to at least one housing of a further electrical interface element and/or means for mechanical connection to a component housing, thus providing a simple combination capability between the housings, and mechanical compatibility with the optoelectronic components of the system. For this purpose, the same mechanical connecting means are used as for the optoelectronic component, in particular latching hooks, guide grooves, pins and the like.

In another extension, plugs for optical cables and/or plugs for electrical cables are provided as further system components and can be coupled to the optoelectronic components and, respectively, to electrical interface elements, with the plug housings having means for mechanical connection to at least one further plug housing. Individual cables may in this case be prefabricated individually with a single plug, and may then be joined together to form a double or multiple plug. The individual plugs and their housings for this purpose once again have connecting means such as latching hooks, guide grooves, pins or the like. The plugs or plug systems can be coupled to the optoelectronic components and/or any electrical interface elements that may be present, in particular such that they can be plugged to them, thus providing compatibility with the further components.

The housings of the individual components of the system are preferably each in the form of a cuboid, in which case two housings can in each case be arranged with one of their housing faces immediately adjacent to one another. The cuboid shape allows a number of individual components of the system to be arranged in a row in a particularly simple manner.

Each component of the system has an optical interface for inputting and/or outputting light, and has electrical contacts. Provision is preferably made for the housing face with the optical interface and the housing face from which the electrical contacts emerge to be arranged at right angles to one another, or opposite one another. In particular, the optical interface and the electrical contacts are in each case located on narrow faces of a cuboid component housing. The components can in this case be connected to one another by their broad housing faces. This accordingly provides a very narrow, flat component. When plugged together with further corresponding components, the optical axes of adjacent optical interfaces are very close to one another, so that transmitter, receiver and transceiver strips can be produced with a high integrated density and with a narrow width overall.

With the above and other objects in view there is also provided, in accordance with the invention, an optoelectronic component, in particular such a component for integration in the above-outline modular system. The component comprises:

a circuit mount disposed in a housing or forming a housing, said housing having narrow housing faces;

a transmitting and/or receiving module disposed on said circuit mount in said housing;

an integrated optical waveguide coupled to said transmitting and/or receiving module, said waveguide extending parallel to said circuit mount and defining an optical interface of the component for inputting and/or outputting light on a narrow housing face; and electrical contacts of the component disposed on a narrow housing face.

That is, the second aspect of the present invention relates to a narrow optoelectronic component, which is preferably used in the modular system. The component has a transmitting and/or receiving module, which is arranged on a flat circuit mount that is either disposed in a housing or itself forms such a housing. According to the invention, an optical waveguide which is coupled to the transmitting and/or receiving module is integrated in the component, runs parallel to the circuit mount and, on one narrow housing face, forms an optical interface for the component, for inputting and/or outputting light. Provision is also made for the electrical contacts of the component likewise to be arranged on a narrow housing face, in particular on a face which runs at right angles to the narrow face with the optical interface.

The optoelectronic component according to the invention provides a particularly narrow transceiver configuration, whose interfaces are located on narrow faces of the component. This makes it possible for the distance between the optical axes of two adjacent components which, for example, form a transceiver, to be short. A further advantage is that the component can easily be redesigned, by redesigning merely the circuit mount. In the case of leadframe solutions that are known from the prior art, in which transmitting and/or receiving modules are arranged on a leadframe and are then encapsulated or molded such that they are clear, relatively complex leadframe redesigns are in contrast required.

The solution according to the invention furthermore allows a high integration density in the housing. Further electrical components such as controller chips or capacitors may also be fitted without any problems on the circuit mount, and may thus also be integrated in the component. System solutions are thus also possible.

The individual optoelectronic and electrical modules are preferably mounted on the circuit mount using SMT technology (surface mounting), resulting in a low-cost and simple configuration.

The components themselves can preferably be connected to a main circuit board by plugging them in, with the circuit mounts of the component running at right angles to the plane of the main circuit mount. The plug-in connection is in this case provided via the electrical contacts of the component which, for example, are in the form of push-in contacts or alternatively in the form of solder contacts or SMT contacts.

In one preferred refinement, the housing is cuboid with four narrow faces and two broad faces. As already mentioned, the optical interface and the electrical contacts are located on the narrow faces. Furthermore, the housing of the component preferably has means for mechanical connection to at least one housing of a further component, or is connected to such means, so that the component can be connected to other components as part of a modular system.

The optical interface, which is formed on one narrow face of the component, preferably has a plug holder which is integrated into the narrow face for coupling of an optical plug, so that such coupling is feasible in a simple manner. The plug holder is, for example, a projecting sleeve, onto which an optical plug can be plugged, or is a fixed piece of optical waveguide, which projects beyond the circuit mount.

In a further embodiment, the optical interface of the component is arranged offset to the rear in the housing face in which it is located. For example, a rigid optical waveguide is used, which projects beyond the populated circuit mount, but is at the same time set back with respect to the surface of the associated housing face. Alternatively, the circuit mount has a projecting subarea which contains the optical waveguide, with the subarea once again being set back with respect to the surface of the associated housing face.

The background to this is that it is desirable to design a plug connection between an optical plug and the component such that the fiber end surface does not become dirty even if it is accidentally connected incorrectly or a so-called "blind" connection is formed, and is reliably protected. The so-called "Kojiri" criterion is known for this purpose, on the basis of which the fiber is protected in a type of "sword sheath" (Japanese: Kojiri). In this case, the optical waveguide that is to be coupled is set back somewhat in the plug in order to protect the optical waveguide that is to be coupled, and the plug forms a waveguide extension circuit mount when coupled to the component.

Other features which are considered as characteristic for the invention are set forth in the appended claims.

Although the invention is illustrated and described herein as embodied in a modular system of optoelectronic components, and an optoelectronic component for use in such a system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic view of an optoelectronic component which can be used in a modular system and has an optical interface as well as electrical contacts;

FIG. 2 is a perspective illustration of one refinement of an optoelectronic component as shown in FIG. 1;

FIG. 3 is a perspective illustration of an optoelectronic component of the CAI type;

FIG. 4 is a transmitting component and a receiving component, which are mechanically connected to one another and form a transceiver component;

FIG. 5 is an end view of a linear module having a large number of transceiver components as shown in FIG. 4 and having an electrical plug component, which are mechanically connected to one another;

FIG. 7 is a perspective view of a first two-dimensional arrangement of optoelectronic components, with the electrical contacts being in the form of solder or push-in contacts;

FIG. 8 is a perspective view of a second two-dimensional arrangement of optoelectronic components, with the electrical contacts being in the form of BGA contacts;

FIG. 9A is a side view of a transmitting component and of a receiving component, which are mechanically connected to one another and together form a cuboid;

FIG. 9B is a front view of a number of transmitting and receiving components as shown in FIG. 9A arranged alongside one another;

FIG. 10 is a perspective view of an optical plug which is connected to an optical cable and can be mechanically connected to further plugs;

FIG. 11 is a perspective view of an electrical plug which is provided with an electrical cable and can be mechanically connected to further (electrical or optical) plugs;

FIG. 12 is a perspective view of the configuration of a number of plugs as shown in FIGS. 10 and 11 in a common surrounding housing, which provides a mechanical connection for the individual plugs;

FIG. 14 is a partly exploded and assembled view of a configuration of the circuit mount and of the components arranged on it in a surrounding housing which is covered by a cover;

FIG. 21A is a top perspective and a bottom perspective view of a further refinement of an optoelectronic component in which the circuit mount is of the MID type; and FIG. 21B is a side view of a number of components which are connected to one another as shown in FIG. 21A.

DESCRIPTION OF THE PREFERRED EMBODIMENTS

Figure 6A:
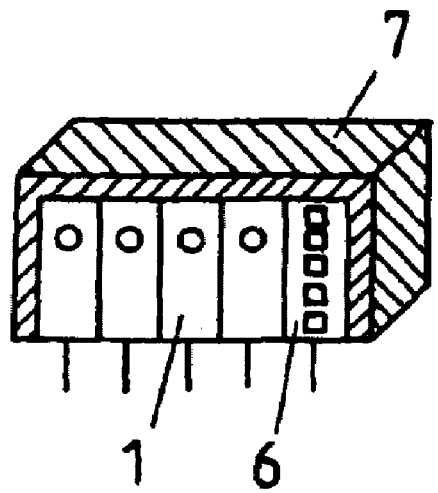
FIG. 6A is a perspective view of a large number of components arranged in a row as shown in FIG. 2, which are mechanically connected to one another by means of a surrounding housing.

Referring now to the figures of the drawing in detail and first, particularly, to FIG. 1 thereof, there is shown, schematically, an optoelectronic component 1, which represents a basic component of a modular system of optoelectronic components. The component 1 is a transmitting component with an optical transmitting element such as a laser diode or an LED, a receiving component with an optical receiving element such as a photodiode, or a transmitting and receiving component (transceiver) with a transmitting element and a receiving element.

The component 1 has an optical interface 2 for inputting light into and for outputting light from the component 1.

Furthermore, electrical contacts 3 are provided, and are used for making electrical contact with the component. In particular, the component 1 is arranged with the electrical contacts 3 on a main circuit board, via which the component 1 and further components that are arranged on such a main circuit board are electrically driven. The electrical contacts are, for example, in the form of push-in, solder, or SMT contacts.

The component 1 has a housing 4, which defines the outer boundary of the component 1. For the purposes of the present invention, a housing is in this case regarded not only as an autonomous housing structure but also as the external structure of an encapsulation material which sheaths optoelectronic components.

In order to make it possible to mechanically connect the component 1 to further components 1 constructed in the same way, the housing 4 has mechanical connecting elements 51, 52, which allow a plug-in connection between the housing 4 and other, corresponding housings. The connecting elements 51, 52 are illustrated only schematically in FIG. 1, and by way of example in the form of a projecting element 51 and a cutout 52, whose shapes correspond to one another. When a number of components 1 are arranged in a row, the connecting elements 51, 52 which are in each case arranged on opposite sides of a housing engage in an interlocking manner in one another, so that two housings or components 1 are mechanically connected via them.

In principle, the mechanical connecting elements may be configured or designed in any desired manner, in particular being in the form of force-fitting, interlocking or force-fitting and interlocking connecting elements. By way of example, they may be latching elements, guide grooves with associated guide tabs and attachment pins that are guided in holes. The only important feature in this case is that means are provided for mechanical connection on the housing 4 of a component 1, allowing a mechanical connection to at least one further housing. The connecting elements 51, 52 with corresponding shapes are in this case preferably provided on each of the opposite faces of a housing.

FIG. 2 shows, schematically, one design variant of a component as shown in FIG. 1, in which the component is in the form of an elongated cuboid with four flat side surfaces and two broad side surfaces. The optical interface 2 and the electrical contacts 3 are in this case respectively located on two flat side surfaces 41, 42 of the housing 4. In the perspective illustration in FIG. 2, one connecting element 51 can be seen, for connecting the housing to the housing of a further component. A corresponding connecting element is located on the opposite face of the component 1'. A component which corresponds to the component 1' will be explained in more detail with reference to FIGS. 13 to 20.

FIG. 3 shows a further design variant of a component 1", which is of the CAI type (CAI=Cavity As Interface). In this case, an optoelectronic module is arranged on a leadframe, which is inserted into the housing 4 and is encapsulated in it by means of an encapsulation material. Guide grooves are preferably provided in the housing, in order to insert the leadframe into the housing 4 in a controlled manner. CAI type components are known, by way of example, from the commonly assigned U.S. Pat. No. 6,309,566 B1 and German patent application DE 199 09 242 A1.

The housing 4 in the embodiment shown in FIG. 3 is cuboid. The optical interface is in the form of a projecting waveguide section 2, which can be coupled to an optical plug. Furthermore, a connecting element 51 is once again provided for connecting the component 1" to further, corresponding components. The electrical contacts 3 are located in or parallel to the plane of the drawing, in contrast to the situation shown in FIG. 2. The same applies to the non-illustrated leadframe which is inserted into the housing 4.

The components illustrated in FIGS. 1 to 3 may have a wide range of internal configurations. For example, a CAI type is used, as described with reference to FIG. 3. Particularly in the case of flat components 1' as shown in FIG. 2, on the other hand, it is preferable for an optoelectronic module, and possibly other electrical components, to be arranged on a circuit board, in which the optical interface is provided via an optical waveguide which is coupled to the optoelectronic module and runs parallel to the circuit board.

SMT components of any desired type may also be used, which can be arranged in a surface-mounted manner on a main circuit board (SMT, surface-mount technology). The primarily important feature for the components 1 is the presence of a standardized housing with means for mechanical connection to at least one further housing. This functionality allows the use of the components as basic components in a modular system of optoelectronic components. The internal configuration of the components, that is to say the technical implementation of optoelectronic signal conversion and the provision of the interfaces, may in principle be as desired.

FIG. 4 shows a transceiver module which is formed from two components 1a, 1b whose housings are mechanically connected to one another (not shown separately). One component in this case is a transmitting component TX, while the other component is a receiving component RX. The arrangement in a narrow housing makes it possible to keep the distances between the optical axes of the respective optical interfaces 2 short.

As shown in FIG. 5, the transmitting components 1a, 1b can be plugged together to form a variable-length transceiver strip. Depending on the desired application, it is thus possible to produce a transceiver strip, for example for parallel optical connections, in a simple manner on the basis of the basic components 1a, 1b. A linear arrangement of just transmitting components or of just receiving components may, of course, likewise be produced. FIG. 5 also shows an electrical interface element 6, which can be connected to a circuit board via contacts 3 in the same way as the optoelectronic components. At the same time, electrical contacts 61 are provided, for example, for an electrical plug which can be connected. The external contours of the interface element 6 correspond to the external contours of the optoelectronic components 1a, 1b. Furthermore, the interface element 6 likewise has means for mechanical connection to the housings of other components, so that any desired connection to the optoelectronic components can be produced.

It should be mentioned that the individual components may have a machine-legible inscription, so that it is possible to achieve large-scale automated production of overall modules, even in widely differing combinations. Furthermore, it is possible to provide for the components to have a colored marking, which indicates their association with a specific class of components, or their capability to be connected to other components. This simplifies manual assembly of the individual components to form overall modules, as well as visual inspection after automatic production. By extending colored markings to additional system components such as plugs and cables, the correctness of the association between the individual components can be checked easily.

FIG. 6A shows the linear arrangement of a number of optoelectronic components 1 as shown in FIG. 1, and of an (optional) interface element 6 as shown in FIG. 5. In this embodiment, the individual components 1, 6 are connected to one another by means of a surrounding housing 7, that is to say the surrounding housing 7 is used for joint arrangement and connection of the individual components 1, 6. When using a surrounding housing 7, there is no need for the mechanical connecting elements provided on the individual housings, so that, to this extent, this results in an alternative refinement to the refinement shown in FIG. 5. However, it is likewise possible to provide for the surrounding housing 7 to be provided only as an additional measure for mechanical connection of the individual components 1, 6, and for them each to have mechanical connecting elements for connection to other housings, in a corresponding manner to that shown in FIG. 1. It is also possible to provide for a number of surrounding housings to have the capability to be connected to one another via mechanical connecting elements such as latching elements, interlocking elements or attachment pins, corresponding to the connection of the individual components 1, 6.

The use of a surrounding housing may be used to achieve additional functionalities. In particular, provision is preferably made for the surrounding housing 7 to be metallically conductive and to provide an electromagnetic shield for the overall module. Furthermore, the surrounding housing 7 may be used as a cooling body, for which purpose, by way of example, specific structures are fitted to the non-illustrated cooling body or a heat sink is fitted (not shown).

Figure 6B:
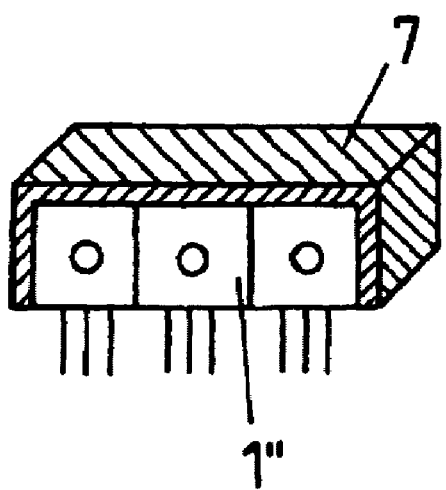
FIG. 6B is a perspective view of a large number of components arranged in a row as shown in FIG. 3, which are mechanically connected to one another by means of a surrounding housing.

The exemplary embodiment shown in FIG. 6B illustrates a linear arrangement of a number of components 1" of the CAI type as shown in FIG. 3 with a surrounding housing 7. The explanatory notes relating to FIG. 6A apply in a corresponding manner.

In a further refinement, the individual components 1, 6 are connected to one another by adhesive bonding. The adhesive in this case provides a means for mechanical connection of the individual housings, by means of which the housings are in each case connected.

In the exemplary embodiment shown in FIG. 7, a number of optoelectronic components 1 are arranged in a two-dimensional array. The optical interface 2 and the electrical interface 3 with the electrical connections are in this case arranged on opposite faces of the housing 4 and not on faces that run at right angles to one another, as in the case of the exemplary embodiments shown in FIGS. 1 to 6.

Two-dimensional linking of individual components 1 makes it possible to produce a two-dimensional transmitter or receiver array.

In the case of a two-dimensional arrangement, the individual components preferably have connecting elements 53, 54 (illustrated schematically) on four faces for mechanical connection of the housings of the individual components 1 to one another. The connecting elements are in this case located on those faces of the cuboid housings 4 on which the optical interface 2 and the electrical contacts 3 are not arranged. The electrical contacts 3 are in the form of solder or push-in contacts in the exemplary embodiment shown in FIG. 7.

FIG. 8 likewise shows a two-dimensional array of optoelectronic components 1, although these are designed to be considerably flatter, since the distance between the optical interface and the electrical contact 3, which is arranged on the opposite housing face, is considerably shorter. The electrical contacts in this refinement are in the form of BGA contacts (ball grid array), for surface-mounting purposes. The components 1 are surface-mounted on a main circuit mount 8.

FIGS. 9a and 9b show an exemplary embodiment in which a basic component of the modular system is formed by a transmitting component and/or receiving component, which together form a cuboid component which can in turn be mechanically connected to further, corresponding components.

In this case, the housing of one component 10a is designed to be angled, forming a cuboid cutout. The housing of the other component 10b is cuboid, to be precise in such a manner that it can be inserted into the cuboid cutout in the other housing, resulting in a cuboid shape overall. The housings of the two components 10a, 10b are in this case once again mechanically connected to one another. The intermediate interfaces 2 between the two components are located on the same housing face, and preferably one above the other. FIG. 9b shows a number of such components, arranged linearly.

As is shown in FIGS. 10 and 11, plugs 11 for optical cables 12 (FIG. 10) and electrical plugs 13 for electrical cables 14 are provided as further system components of the modular system. The individual plugs can in this case each be combined to form double or multiple plugs, for which purpose the plug housings have means for mechanical connection to further plug housings, for example once again latching elements or the like. Corresponding multiple plugs 15a, 15b are shown in FIGS. 10 and 11, in which case optical and electrical plugs can also be connected to one another.

As is shown in FIG. 12, the individual plugs 11, 13 are installed in a common surrounding housing 16. This results in additional fixing for the plugs. The fiber is preferably set back in each individual plug 11, 13, in order to satisfy the Kojiri criterion. Alternatively, a set-back arrangement of the plugs 11, 13 is provided in the surrounding housing 16 in order to satisfy the Kojiri criterion. It should be mentioned that the surrounding housing 16 may also be designed such that it is open on one face, in the same way as the surrounding housing shown in FIGS. 6a, 6b.

Figure 13A:
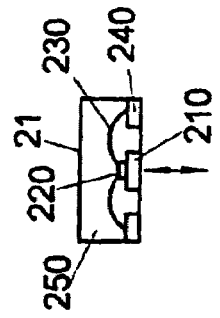
FIG. 13A is a side view of a transmitting and/or receiving module of the component shown in FIG. 13.
Figure 13C:
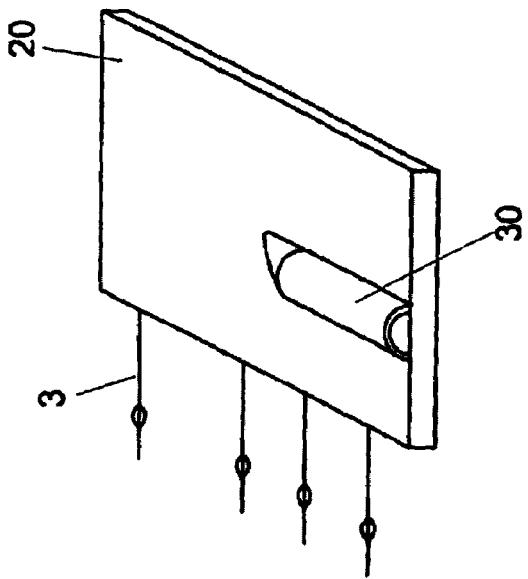
FIG. 13C is a perspective view of the other face of the circuit mount shown in FIG. 13.
Figure 13:
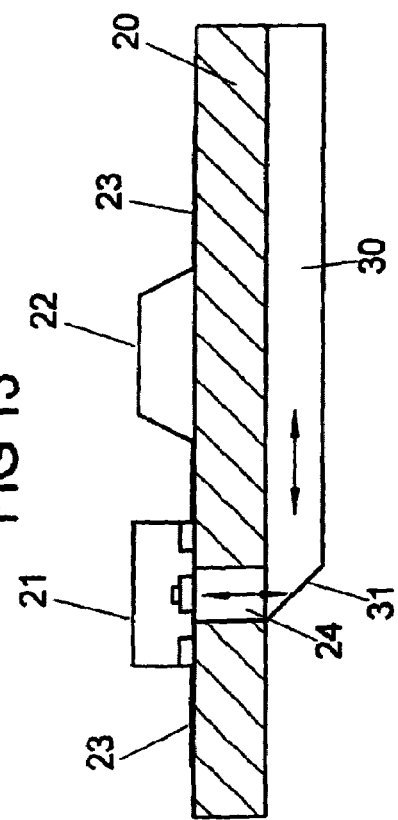
FIG. 13 is a cross section through a narrow optoelectronic component with an integrated optical waveguide.

FIGS. 13 to 20 show various embodiments of a flat optoelectronic component, corresponding to the optoelectronic component shown in FIG. 2. As is shown in FIG. 13, the component has a flat circuit mount 20, on one face of which an optoelectronic transmitting and/or receiving module 21 as well as further electrical components 22 are arranged, and on whose other face an optical waveguide 30 is arranged. Electrical conductor tracks 23 are provided on that face of the circuit mount 20 which is fitted with the electrical and optoelectronic components, in order to make electrical contact with the elements 21, 22.

The transmitting and/or receiving module 21 is illustrated in more detail in FIG. 13A. This has an optical component 220 which is arranged on a mount 210 and which may be, for example, a photodiode, an LED or a laser diode. This is either a transmitting module or a receiving module, depending on the component that is used. Contact is made with the optical component 210, for example, by means of two bonding wires 230, which are connected to electrical contacts 240 on the lower face of the module 21, in which case the module 21 may be surface mounted on the circuit mount 20, via the electrical contacts 210.

In one alternative refinement, the elements 210, 220 comprise not only a receiving element (photodiode) but also a transmitting element (LED laser). By way of example, the transmitting element 220 is arranged above the receiving element 210, and the latter is transparent for the wavelength transmitted by the transmitting element 220. A configuration such as this is a transmitting and receiving module which at the same time transmits light at a first wavelength and detects light at a second wavelength, although in principle the two wavelengths may be identical. The components of the module 21 are injected into a pressing compound 250.

The lower face (on the side of the electrical contacts 240) provides optical access to the module.

The further components 22 are preferably likewise SMT components and are, for example, integrated driver circuits, preamplifiers or capacitors.

The circuit mount 20 may on the one hand be in the form of a printed circuit board (PCB), one side of which is populated with prefabricated electrical and optical components. Alternatively, the circuit mount may also be a so-called MID component (molded interconnected device). This is a molding which is injection-molded from plastic and is modified with a laser in such a way that conductor tracks can be formed directly on the plastic. In contrast to a board, this molding may also carry out the function of a housing. An exemplary embodiment of this will be described with reference to FIGS. 21A, 21B.

The optical waveguide 30 may likewise be formed in many ways. Firstly, it may be a standard optical fiber which is adhesively bonded onto the circuit mount 20. In another variant, the optical waveguide is applied to the circuit mount 20 by direct laser structuring (DLS). To do this, the circuit mount is covered with a plastic layer, which is written on using a laser while still in the liquid state, with those areas which are used as the waveguide being cured, and the remaining areas being removed. The optical paths in this case remain. It is likewise feasible to use a clear injection-molded part, which is sheathed or mirrored, as the optical waveguide. In principle, other methods are also feasible for forming or arranging an optical waveguide on the circuit mount 20.

The circuit mount 20 has a hole 24 through which the transmitting and/or receiving module 21 is optically coupled to the optical waveguide 30. In this case, the light beam is deflected through 90° on an obliquely running surface 31 of the optical waveguide.

Figure 13B:
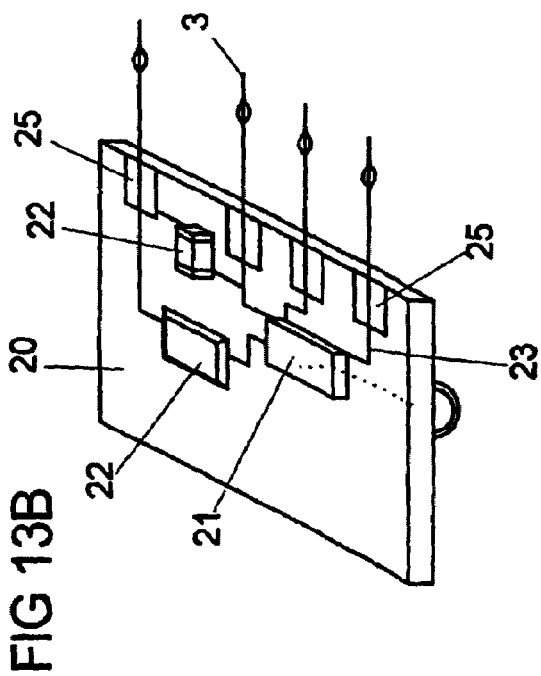
FIG. 13B is a perspective view of one face of the circuit mount shown in FIG. 13.

FIG. 13B shows the components from FIG. 13 in the form of a perspective view of that face of the circuit mount 20 which is provided with the optical and electronic components. In this case, a number of electrical contacts 3 (in the form of push-in contacts) are connected to connecting pads 25 on the circuit mount 20, and these are in turn connected to the electrical conductor tracks 23. The electrical contacts 3 are located in the same plane as the circuit mount 20, and point at right angles away from the side boundary of the circuit mount 20.

FIG. 13C shows the circuit board from the other side. This face has no optical or electrical components, and only the optical waveguide 30 which is integrated in this component is arranged on this face of the circuit mount 20. The optical waveguide 30 in this case extends as far as the edge of the circuit mount 20, where it forms an optical interface.

As is shown in FIG. 14, the populated circuit mount 20 is inserted into a housing 4. The housing 4 has a circumferential frame 41, which defines the narrow faces of the housing, and a side wall 44, which is firmly connected thereto, on one broad side surface of the cuboid housing. A number of positioning and holding pins 441 are arranged on the fixed wall 44, and the populated circuit mount 20 is then plugged onto them, followed by a cover 43 which forms the other broad side surface of the housing 4. For this purpose, the circuit mount 20 and the cover 43 have holes 26, 431 which are designed to correspond to the positioning and holding pins 441. An appropriate assembly process results in an optoelectronic component 100 which is cuboid with four narrow faces and two broad faces. The optical interface 2 and the electrical contacts 3 are in this case each arranged on one narrow face of the cuboid component housing.

The optical interface 2 in the illustrated exemplary embodiment is formed by an integrated plug holder in the form of a projecting sleeve, to which an optical plug can be coupled. This makes the connection of an optical plug easier.

Optionally, the housing of the component 100, as is shown at the bottom in FIG. 14, may have mechanical connecting elements which allow connection to further corresponding components 100, so the optoelectronic component can be used for the purposes of the modular system described above. The mechanical connecting elements may in this case in principle be of any desired type. As an example of this, FIG. 14 shows a trapezoidal cutout 55 on one broad side surface of the housing. A trapezoidal projection 56, with a corresponding shape to it, is located on the other face. Mutually adjacent components can thus be connected to one another in an interlocking manner by longitudinal movements.

The component 100 preferably has a height H of between 0.5 and 1.5 cm, a depth T of between 0.5 and 2 cm, and a width B of between 3 and 7 mm, although these details should be regarded only as being by way of example.

Figure 15:
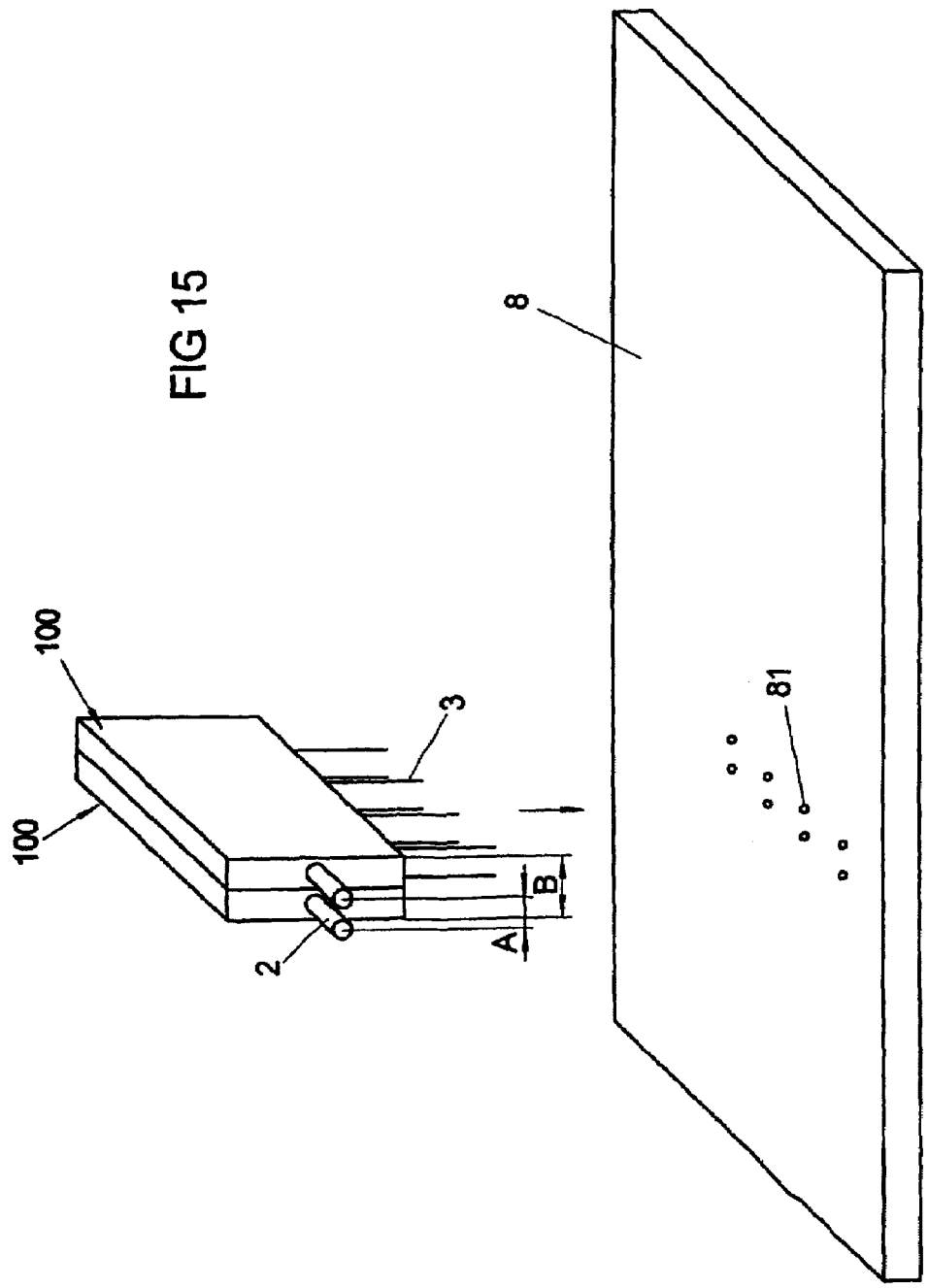
FIG. 15 is a perspective view showing two narrow optoelectronic components alongside one another on a main circuit mount.

FIG. 15 shows two components 100 which are mechanically connected to one another. Since the components are flat, the distance A between the optical axes of the respective optical waveguides is very short. The overall thickness B is also very small, since the individual components 100 are thin. Provided that one component 100 is a transmitting component and the other component 100 is a receiving component, this results overall in a compact transceiver of a narrow type. The transceiver is mounted by means of the electrical contacts on a main circuit mount 8, for which purpose the contacts 3 are, by way of example, pushed or soldered into corresponding openings 81 in the main circuit mount. In this case, it should be mentioned that due to the fact that the electrical contacts emerge from one longitudinal face of the component 100, such components can be provided in relatively large numbers.

If necessary, a large number of corresponding transceivers may be arranged and in this case connected to one another on the main circuit mount 8, corresponding to the configuration shown in FIG. 5.

Figure 16:
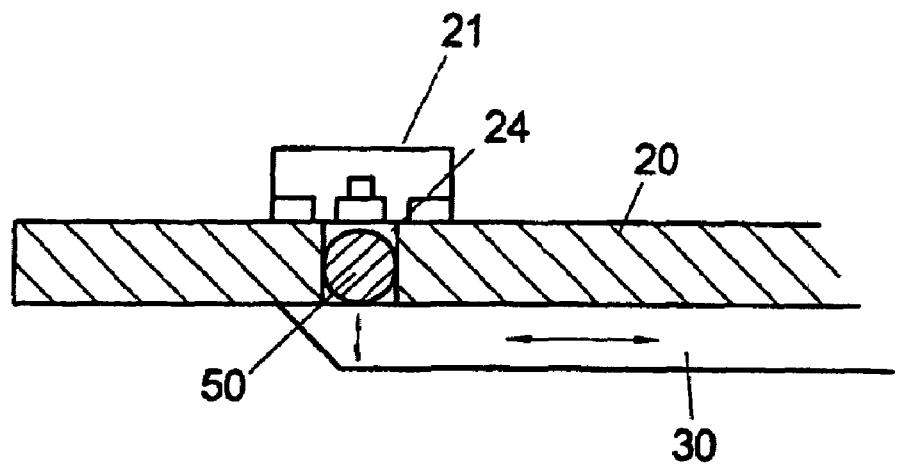
FIG. 16 is a section through the configuration of FIG. 13, with a lens being located in a hole in the circuit mount.

In the exemplary embodiment shown in FIG. 16, a coupling lens 50 is integrated in the cutout 24 of the circuit mount 20 and is used to improve the optical coupling between the optoelectronic module 21 and the optical waveguide 30.

Figure 17:
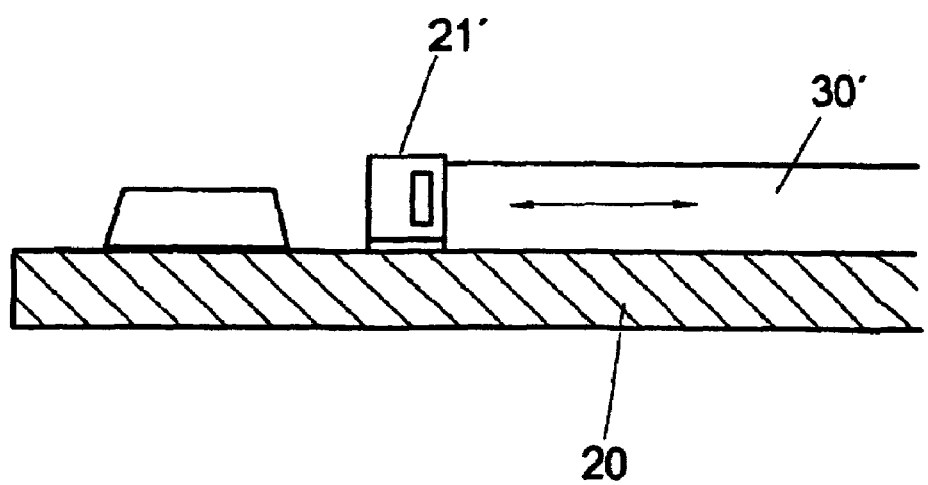
FIG. 17 is a cross section of an alternative refinement of an optoelectronic component, in which an optical transmitting and/or receiving element is arranged on the same face of a circuit board as the integrated optical waveguide.

FIG. 17 shows a refinement in which the transmitting and/or receiving module 21' and the optical waveguide 30' are arranged on the same face of the circuit mount 20. In this case, the module 21' has an LED or laser diode which emits parallel to the circuit mount 20, or a photodiode which detects light running parallel to the circuit mount 20.

Figure 18:
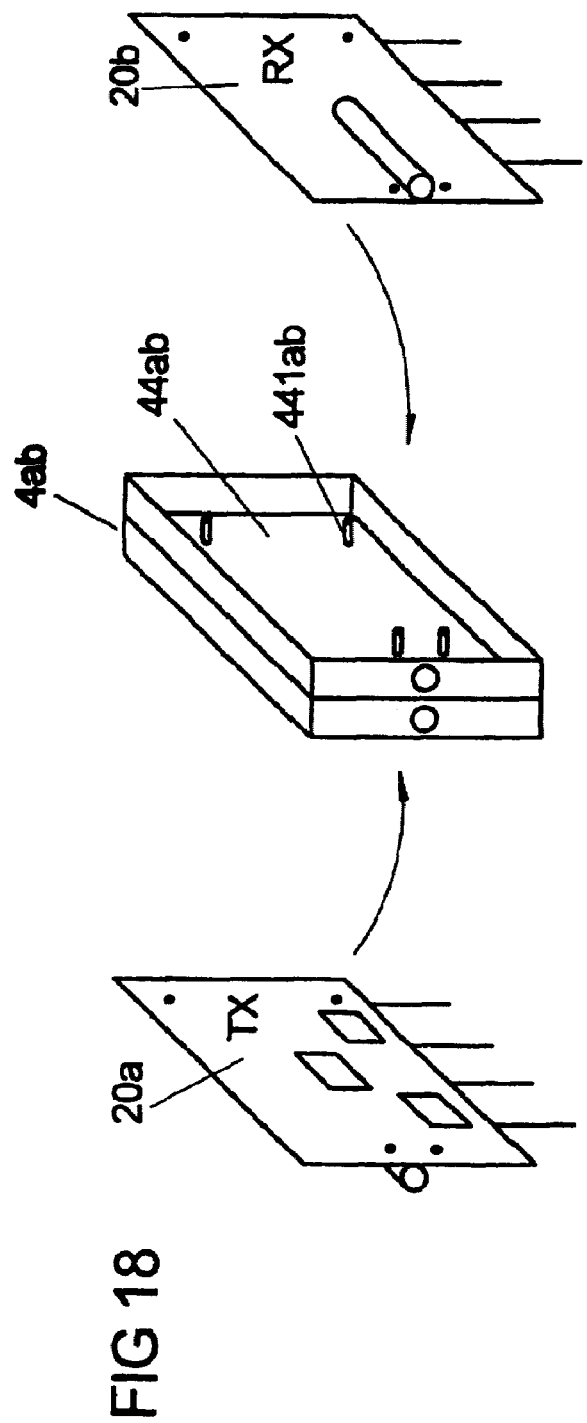
FIG. 18 is an exploded perspective view of a transceiver arrangement, in which a circuit board with a transmitting component and a circuit board with a receiving component are inserted into a common housing.

FIG. 18 shows an exemplary embodiment in which a first circuit board 20a with a transmitting module and a second circuit board 20b with a receiving module are inserted into a common housing 4ab. The circuit mount 20a, 20b is designed in a corresponding manner to that shown in FIG. 13. Once the circuit mounts have been attached to positioning and holding pins 441ab on a central intermediate wall 44ab, covers (which are not illustrated separately) are fitted to the two open surfaces of the housing. If required, these may once again contain means for connecting the housing to further housings. The covers can also be obviated by a suitable board design (large-area ground planes). The means for connection to other housings are then located on the housing 4ab.

Figure 19:
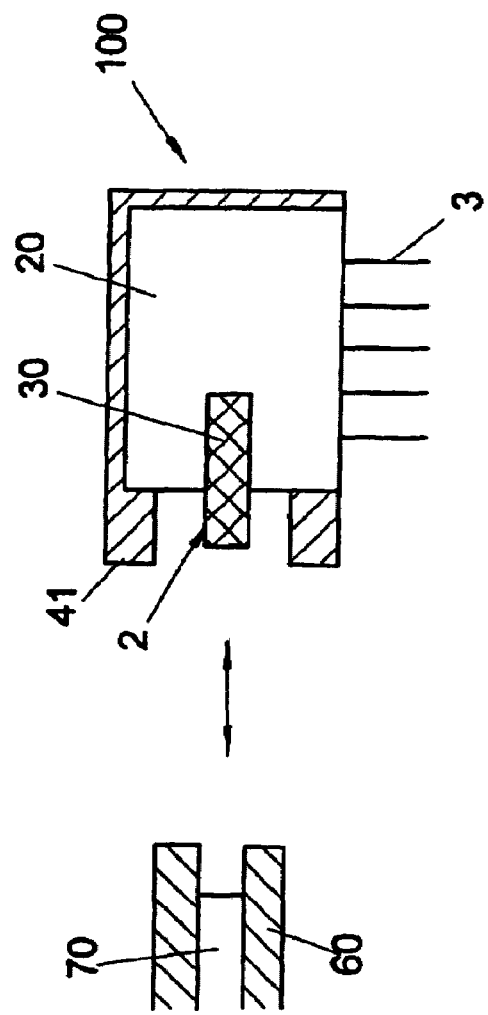
FIG. 19 is a schematic side view of an alternative refinement of a surrounding housing, in which the housing of the optical component projects beyond the optical interface.

FIG. 19 shows an exemplary embodiment which implements the Kojiri criterion for the connection of an optical plug to the optical interface 2 of the component. In this case, provision is made for the optical interface 2 to be arranged offset to the rear with respect to the housing face 41 in which it is located. At the same time, the optical interface 2 projects beyond the circuit mount 20. The interface 2 is provided, for example, by a rigid optical waveguide (for example made of glass or plastic). The projecting part in this case represents an optical waveguide extension which, in this case, provides the optical interface. Alternatively, the optical interface may also be formed by a projecting area of the circuit board which contains the optical waveguide 30, so that the optical waveguide extension is formed from a piece of the board with the optical waveguide disposed on it.

The Kojiri criterion is satisfied since the optical waveguide 70 which is arranged in an optical plug 60 that can be connected is set back somewhat in the optical plug 60, in order to protect the optical waveguide 70. During the connection process, the plug 60 surrounds the optical waveguide extension 2. Latching nevertheless takes place between the plug 60 and the housing 41 (not shown separately) in this case in order to absorb forces during mating and disconnection of the plug 60, so that the optical waveguide extension 2 is not subjected to any mechanical loads.

Furthermore, the illustrated connection provides very good optical coupling directly between the two optical waveguides 2, 70, since considerably less coupling losses occur than when the plug is first of all coupled to the housing.

Figure 20:
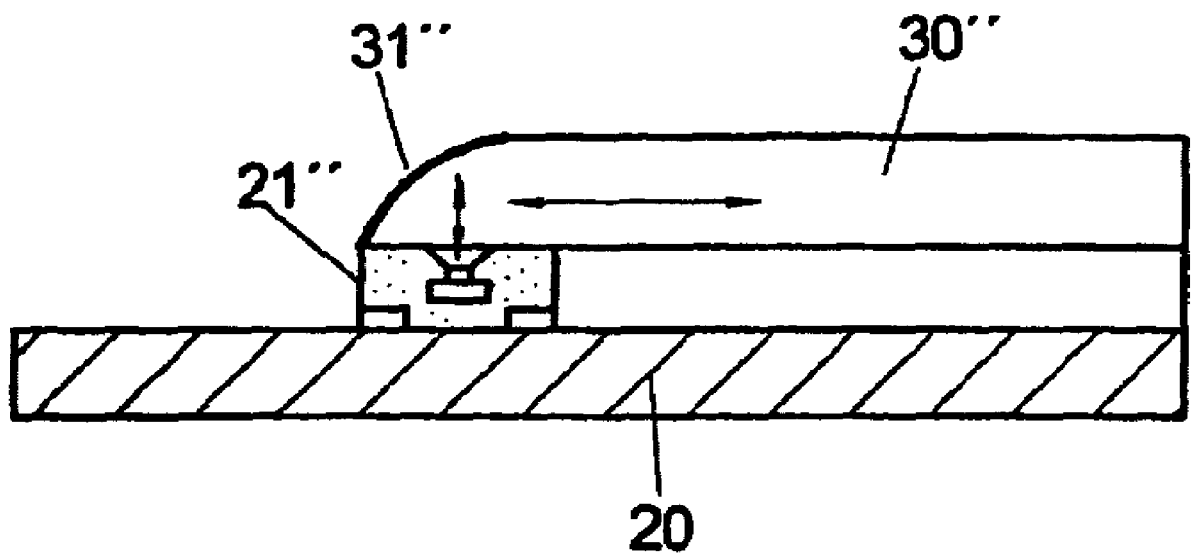
FIG. 20 is a side view of a further refinement of an optoelectronic component, in which an optical transmitting and/or receiving component is arranged on the same face of a circuit mount.

FIG. 20 shows an embodiment in which the transmitting and/or receiving module 21" is aligned so that is emits in the upward direction. In a corresponding manner, the optical waveguide 30" is located at a distance from the circuit mount 20. The optical waveguide is preferably formed from a clear plastic injection-molded part, which is metalized or has some other suitable coating of a material with a relatively low refractive index in the area of the beam deflection device 31", so that the light is guided in a suitable manner between the transmitting and/or receiving module 21" and the optical waveguide 30". This refinement advantageously does not need any hole to be formed in the circuit mount 20. A further advantage is that the optical waveguide, which is in the form of an injection-molded part, may be shaped such that an optical plug may be connected directly.

FIGS. 21A, 21B show a refinement in which the circuit mount for the component 100' is in the form of an MID circuit mount 200 (molded interconnected device). MID technology allows the circuit mount 200 to have a three-dimensional configuration. As already explained, this is a molding which is injection-molded from plastic and is modified with a laser in such a way that conductor tracks are formed directly on the plastic. In the exemplary embodiment shown in FIGS. 21A, 21B, the MID circuit mount 200 forms the housing, possibly together with an optional cover 400 (see FIG. 21B).

The circuit mount 200 in this case has side bars 201, which may optionally also be formed on the end faces (shown by dashed lines). This results in side surfaces 200a, 200b on the narrow faces of the component. The circuit mount 200 is fit with an optoelectronic module 21 and with electrical components 22 as has been described with reference to FIGS. 13–13C, so that, to this extent, reference should be made to these figures. An optical waveguide 30 is provided in a rear-face cutout 202 in the circuit mount 200, and provides an optical interface 2 on one narrow face 200b of the component 100'. The optical interface 2 is arranged in a plug socket 200b' on the narrow face 200b. The rear face 203 of the circuit mount 200 is flat, apart from the cutout 202, and represents the rear face of the housing.

Electrical contact pins 3 for making electrical contact are injected into or integrated in an narrow face 200a of the MID circuit mount 200.

The upper face 204, which is open between the bars 201, of the circuit mount/housing 200 may be covered by a cover 400 corresponding to the cover shown in FIG. 21B, or alternatively may be encapsulated with an encapsulation material. It is optionally also possible to provide for the populated MID mount 200 to be coated with a protective layer or a varnish, so that there is no need for a cover.

In one design variant, the MID mount 200 is completely metalized on the outside.

In order to provide a modular system, schematically illustrated mechanically connecting elements 57, 58 are provided on the broad upper faces and lower faces of the component 100' and of the housing (which is formed by the circuit mount 200), and allow mechanical connection to further housings. A number of such interconnected components 100' are illustrated in FIG. 21B. A cover 400 is also optionally provided for the component located on the outside.

The use of an MID circuit mount has the advantage that the housing and circuit mount are combined. The electrical contacts 3 can be injected into the circuit mount. A plug socket 200b may also be integrated directly in the circuit mount.

The embodiments of the invention are not restricted to the exemplary embodiments described above. By way of example, it is possible for the housings for the optoelectronic components not to be closed on all six faces but, instead of this, to be designed to be open on one or two faces. For example, the housing is designed to be open at the bottom, with the circuit mount in the housing then not being adjusted via holes, but by means of guide grooves, along which the circuit mount is inserted into the housing from underneath, and is positioned.

The primarily important features of the component described in FIGS. 13 to 21 are that an optical waveguide is integrated in the component, runs parallel to the circuit mount and, on one narrow housing face, forms an optical interface for the component for inputting and/or outputting light. The electrical contacts of the component are preferably likewise arranged on a narrow housing face (which may also be designed to be open), in order to ensure a narrow configuration.

We claim:

1. A modular system of optoelectronic components, comprising:

a plurality of prefabricated optoelectronic components selected from the group consisting of light-emitting components having a light-emitting element, light-detecting components having a light-detecting element, and transceiver components having a light-emitting element and a light-detecting element;

each of said components having a standardized housing and at least one of said light-emitting element and said light-detecting element located inside said housing;

said housing being formed with or connected to a connecting device for mechanically connecting said housing to at least one respectively other housing of a further component;

each component having a cuboid component housing with narrow faces and broad faces, and each component having an optical interface for inputting and/or outputting light and electrical contacts, said optical interface and said electrical contacts being disposed on said narrow faces of said cuboid component housing, and said components being connectible to one another at said broad faces by said mechanical connecting device.

2. The modular system of optoelectronic components according to claim 1, wherein individual said components are formed with a machine-readable inscription.

3. The modular system of optoelectronic components according to claim 1, wherein individual said components carrying a colored marking, said marking indicating an association of a respective said component with a specific class of components, or a capability of the respective said component to be connected to other components.

4. The modular system of optoelectronic components according to claim 1, wherein said narrow faces include a first housing face with said optical interface and a second housing face from which said electrical contacts emerge, said narrow faces being disposed at right angles to one another.

5. The modular system of optoelectronic components according to claim 1, wherein a respective said light-emitting component and a respective said light-detecting component together forming one cuboid component adapted to be mechanically connected to further corresponding components, and wherein:
said housings of said light-emitting component and said light-detecting component being mechanically connectible;
one of said housings being formed with a cuboid cutout;
another one of said housings having a cuboid shape for insertion into said cuboid cutout in the one housing, with a cuboid shape being produced overall; and
said optical interfaces of said light-emitting component and of said light-detecting component being disposed on the same housing face.

6. An optoelectronic component, comprising:
a circuit mount disposed in a housing or forming a housing, said housing having narrow housing faces, said housing including at least one housing face having a device for mechanical connection to at least one housing of a further optoelectronic component;
at least one of a light-emitting and light-detecting module disposed on said circuit mount in said housing;
an integrated optical waveguide coupled to said light-emitting and/or light-detecting module, said waveguide extending parallel to said circuit mount and inside said housing and defining an optical interface of the component for inputting and/or outputting light on a narrow housing face, said narrow housing face with said optical interface being disposed perpendicular to said housing face having said device for mechanical connection; and
electrical contacts of the component disposed on a narrow housing face.

7. The component according to claim 6 configured for integration in a modular system.

8. The component according to claim 6, wherein said housing is a cuboid housing with four narrow faces and two broad faces.

9. The component according to claim 6, which further comprises a device connected to said housing for mechanically connecting said housing to a respective housing a further component.

10. The component according to claim 6, wherein all of said electrical contacts of said component are disposed on the same narrow face of said housing extending at right angles to the narrow face carrying said optical interface.

11. The component according to claim 6, wherein said light-emitting and/or light-detecting module is disposed on a first face of said circuit mount and said optical waveguide is disposed on a second face of said circuit mount opposite said first face, with an optical axis of said light-emitting and/or light-detecting module running perpendicular to said circuit mount, and wherein emitted or detected light passes through said circuit mount and communicates with said optical waveguide at a region of a cutout formed in said circuit mount.

12. The component according to claim 11, which comprises a lens disposed in said cutout formed in said circuit mount.

13. The component according to claim 6, wherein said light-emitting and/or light-detecting module and said optical waveguide are disposed on a common face of said circuit mount, with said light-emitting and/or light-detecting module emitting and/or detecting light parallel to said circuit mount.

14. The component according to claim 6, wherein said light-emitting and/or light-detecting module and said optical waveguide are arranged on a common side of said circuit mount, with an optical axis of said light-emitting and/or light-detecting module running at right angles to said circuit mount, and which further comprises a beam deflection device for coupling light between said light-emitting and/or light-detecting module and said optical waveguide, said optical waveguide extending at a distance from said circuit mount.

15. The component according to claim 6, wherein said component housing is formed with a circumferential frame defining said narrow faces, and at least one cover.

16. The component according to claim 6, wherein said optical interface is formed on one narrow housing face, and said optical interface has a plug holder integrated in said narrow face, for coupling an optical plug.

17. The component according to claim 6, which comprises first and second circuit mounts each having an integrated optical waveguide, with said optical waveguides being introduced into a common housing, and wherein said first circuit mount is fitted with a light-emitting module and said second circuit mount is fitted with a light-detecting module, and wherein two associated optical interfaces are formed on a common narrow face of said housing.

18. The component according to claim 6, wherein an optical interface of a plug to be coupled to the component is recessed with respect to a plug end surface, and which comprises structures formed on the component for holding the plug.

19. The component according to claim 6, wherein said optical waveguide is produced by direct laser-structuring of a plastic layer applied to said circuit mount, by adhesively bonding a standard optical fiber, or by applying a plastic waveguide to said circuit mount.

20. An optoelectronic component, comprising:
a circuit mount disposed in a housing or forming a housing, said housing having narrow housing faces;
at least one of a light-emitting and light-detecting module disposed on said circuit mount in said housing;
an integrated optical waveguide coupled to said light-emitting and/or light-detecting module, said waveguide extending parallel to said circuit mount and inside said housing and defining an optical interface of the component for inputting and/or outputting light on a narrow housing face; and electrical contacts of the component disposed on a narrow housing face, all of said electrical contacts of said component being disposed only on the same narrow face of said housing extending at right angles to the narrow face carrying said optical interface;

said light-emitting and/or light-detecting module disposed on a first face of said circuit mount and said optical waveguide disposed on a second face of said circuit mount opposite said first face, with an optical axis of said light-emitting and/or light-detecting module running perpendicular to said circuit mount, and wherein emitted or detected light passes through said circuit mount and communicates with said optical waveguide at a region of a cutout formed in said circuit mount.

21. The component according to claim 20 configured for integration in a modular system.

22. The component according to claim 20, wherein said housing is a cuboid housing with four narrow faces and two broad faces.

23. The component according to claim 20, wherein said housing includes a device for mechanical connection to at least one housing of a further optoelectronic component.

24. The component according to claim 20, which further comprises a device connected to said housing for mechanically connecting said housing to a respective housing of a further optoelectronic component.

25. The component according to claim 20, which comprises a lens disposed in said cutout formed in said circuit mount.

26. The component according to claim 20, wherein said component housing is formed with a circumferential frame defining said narrow faces, and at least one cover.

27. The component according to claim 20, wherein said optical interface is formed on one narrow housing face, and said optical interface has a plug holder integrated in said narrow face, for coupling an optical plug.

28. The component according to claim 20, wherein an optical interface of a plug to be coupled to the component is recessed with respect to a plug end surface, and which comprises structures formed on the component for holding the plug.

29. The component according to claim 20, wherein said optical waveguide is produced by direct laser-structuring of a plastic layer applied to said circuit mount, by adhesively bonding a standard optical fiber, or by applying a plastic waveguide to said circuit mount.

30. An optoelectronic component, comprising:

a circuit mount disposed in a housing or forming a housing, said housing having narrow housing faces;

at least one of a light-emitting and light-detecting module disposed on said circuit mount in said housing;

an integrated optical waveguide coupled to said light-emitting and/or light-detecting module, said waveguide extending parallel to said circuit mount and inside said housing and defining an optical interface of the component for inputting and/or outputting light on a narrow housing face; and electrical contacts of the component disposed on a narrow housing face, all of said electrical contacts of said component being disposed only on the same narrow face of said housing extending at right angles to the narrow face carrying said optical interface;

said light-emitting and/or light-detecting module and said optical waveguide are arranged on a common side of said circuit mount, with an optical axis of said light-emitting and/or light-detecting module running at right angles to said circuit mount, and which further comprises a beam deflection device for coupling light between said light-emitting and/or light-detecting module and said optical waveguide, said optical waveguide extending at a distance from said circuit mount.

31. An optoelectronic component, comprising:

a common housing having a first narrow face and a second narrow face;

first and second circuit mounts each having an integrated optical waveguide, with said optical waveguides being introduced into said common housing, said first circuit mount having a light-emitting module and said second circuit mount having a light-detecting module, and two associated optical interfaces are formed on said first narrow face being a common narrow face of said common housing;

said optical waveguides extending parallel to said first and second circuit mounts, respectively, and inside said common housing and defining said optical interfaces of the component for inputting and/or outputting light on said common narrow face; and electrical contacts of the component disposed on said second narrow face of said common housing, all of said electrical contacts of said component being disposed only on said second narrow face of said housing extending at right angles to said common narrow face carrying said optical interfaces.

* * * * *